US007061287B2

(12) United States Patent  (10) Patent No.: US 7,061,287 B2
Jeon  (45) Date of Patent: Jun. 13, 2006

(54) DELAY LOCKED LOOP

(75) Inventor: Young Jin Jeon, Daejeon (KR)

(73) Assignee: Hynix Semiconductor Inc., Kyungki-Do (KR)

( * ) Notice: Subject to any disclaimer, the term of this patent is extended or adjusted under 35 U.S.C. 154(b) by 18 days.

(21) Appl. No.: 10/883,413

(22) Filed: Jun. 30, 2004

(65) Prior Publication Data

US 2005/0110541 A1  May 26, 2005

(30) Foreign Application Priority Data

Nov. 20, 2003  (KR) ...................... 10-2003-0082457

(51) Int. Cl.
*H03L 7/06* (2006.01)
(52) U.S. Cl. ........................ 327/149; 327/47
(58) Field of Classification Search ...................... None
See application file for complete search history.

(56) References Cited

U.S. PATENT DOCUMENTS

| | | | | |
|---|---|---|---|---|
| 5,223,755 | A | * | 6/1993 | Richley ........................ 327/158 |
| 5,614,855 | A | | 3/1997 | Lee et al. |
| 5,757,238 | A | * | 5/1998 | Ferraiolo et al. ............. 331/16 |
| 5,815,016 | A | | 9/1998 | Erickson |
| 5,875,219 | A | | 2/1999 | Kim |
| 5,933,058 | A | * | 8/1999 | Pinto et al. .................... 331/17 |
| 6,066,988 | A | * | 5/2000 | Igura ............................ 331/18 |
| 6,154,508 | A | * | 11/2000 | Ott .............................. 375/354 |
| 6,222,894 | B1 | | 4/2001 | Lee |
| 6,326,826 | B1 | | 12/2001 | Lee et al. |
| 6,340,904 | B1 | | 1/2002 | Manning |
| 6,470,060 | B1 | | 10/2002 | Harrison |
| 6,504,408 | B1 | | 1/2003 | von Kaenel |
| 6,556,489 | B1 | | 4/2003 | Gomm et al. |
| 6,657,463 | B1 | * | 12/2003 | Velez .......................... 327/116 |
| 6,795,516 | B1 | * | 9/2004 | Takekawa et al. .......... 375/376 |
| 6,822,494 | B1 | * | 11/2004 | Kim ............................ 327/160 |
| 6,829,715 | B1 | * | 12/2004 | Chiao et al. ................. 713/401 |
| 6,839,301 | B1 | * | 1/2005 | Lin et al. ..................... 365/233 |
| 6,859,413 | B1 | * | 2/2005 | Phan et al. ................... 365/233 |
| 2001/0045868 | A1 | * | 11/2001 | Takeyabu et al. ............... 331/2 |
| 2002/0130691 | A1 | | 9/2002 | Silvestri |
| 2003/0011414 | A1 | | 1/2003 | Bell |
| 2003/0085744 | A1 | | 5/2003 | Heo et al. |
| 2005/0174155 | A1 | * | 8/2005 | Heightley et al. ........... 327/158 |

FOREIGN PATENT DOCUMENTS

JP           01146426 A  *  6/1989

* cited by examiner

*Primary Examiner*—Timothy P. Callahan
*Assistant Examiner*—Cassandra Cox
(74) *Attorney, Agent, or Firm*—Marshall, Gerstein & Borun LLP

(57) ABSTRACT

Provided is a delay locked loop comprising: a delay unit for delaying a clock supplied from an external chipset by a predetermined delay amount; a replica for delaying the clock delayed in the delay unit by a delay amount of a clock path and a data path; and a phase detector for generating a signal for controlling the delay amount of the delay unit comparing the clock supplied from the external chipset with a phase of an output of the replica, and generating a reset signal through detection of a change of a clock frequency supplied from the external chipset.

23 Claims, 5 Drawing Sheets

DELAY LOCKED LOOP

This application relies for priority upon Korean Patent Application No. 2003-82457 filed on Nov. 20, 2003, the contents of which are herein incorporated by reference in their entirety.

BACKGROUND

1. Field of the Invention

The present invention relates to a delay locked loop (DLL) of a semiconductor memory device and, more specifically, to a delay locked loop capable of detecting a change of a clock frequency supplied from a chipset and resetting a phase detector.

2. Discussion of Related Art

Generally, in a semiconductor memory device operating synchronized with an external clock signal, in case where an internal clock signal is delayed for a constant time comparing with the external clock signal, the high frequency operation performance of the semiconductor memory device is deteriorated. Especially, a time when data is outputted after application of the external clock signal, i.e., an output data access time (tAC) is increased. Therefore, in order to prevent the high frequency operation performance of the semiconductor memory device form being deteriorated, a circuit is required to precisely synchronize a phase of the internal clock signal to a phase of the external clock signal, and a delay locked loop is generally used for it. In addition, the delay locked loop is widely used for a clock recovery system, a precise time-to-digital conversion, and high-speed serial links, etc.

Meanwhile, according to an application, one of an analog DLL, a digital DLL and a hybrid DLL may be used. Especially the analog DLL has good jitter characteristics, while it has an essential problem that it is locked in a False State that an internal clock signal is delayed by more than one period with respect to a reference clock signal, for example, an external clock signal. The False State locking is not preferable due to Jitter Accumulation and increased Noise Susceptibility.

Also, the delay locked loop is used to generate clocks having negative delay characteristics of CMOS VLSI circuit and DRAM, etc. The delay locked loop functions to cause an output of data to be coincident with the external clock as the delay locked loop receives the external clock, compensates a delay component of a clock path and a data path, and outputs a signal leading the external clock.

The external clock inputted to a circuit such as DRAM, etc. is applied from a chipset such as a memory controller, and so on. When the frequency of the external clock is varied, the delay locked loop has a high possibility of a malfunction. Thus, there is a problem in that the data output is not synchronized to the clock. FIG. 1 is a block diagram of a conventional delay locked loop.

A delay unit A delays an external clock by a predetermined amount and outputs it.

A replica B is a copy of the clock path and data path, and the negative delay amount of the delay locked loop is determined according to the amount. A phase detector C functions to compare the external clock with the phase of the external clock passing through the delay unit A and the replica B. A clock driver D functions as a driver that supplies the delayed clock delayed in the delay unit A with other circuits.

An operation principle of the delay locked loop of FIG. 1 will be explained in detail below with reference to FIG. 2.

In case where a clock CLOCK is inputted to the delay unit A from an external chip, the delay unit A delays the clock CLOCK and generates a delayed clock CLOCK_D. The delayed clock CLOCK_D is inputted to the replica B. The replica B delays the delayed clock CLOCK_D by a delay amount of the clock path and data path, and generates a clock feedback signal CLOCK_FEEDBACK. The phase detector C sends the delay unit A a signal to increase a delay amount of the delay unit A until a phase of the clock CLOCK is identical to a phase of the clock feedback signal CLOCK_FEEDBACK. Through these processes, when the clock CLOCK and the clock feedback signal CLOCK_FEEDBACK are coincident with each other, the delay unit A is locked and a delay synchronous clock signal DLL_CLK is generated. As a result, it is possible to compensate the delay component of the clock path and data path, and output data DATA synchronized with the external clock CLOCK.

FIG. 3 shows a detailed circuit of the prior art phase detector, and FIG. 4 shows a timing chart for describing the operation thereof.

Initially, a delay amount of the delay unit A is set to "0", the clock feedback signal CLOCK_FEEDBACK generates a signal lagging by a delay amount of the replica B, comparing with the clock CLOCK. At this time, the phase detector C compares the phase at a rising edge of the clock CLOCK. For example, at a time T1, an output of a NAND gate is low. An output CMP_EN of a NOR gate maintains a high state until a signal passing a delay unit 10 and an inverter G2 becomes high. During the time T1, one output node N1 of a latch 20 maintains the low state and another output node N2 maintains the high state. An output N3 of a NAND gate G3 becomes high and output N4 of NAND gate G4 becomes low. Therefore, an output SHIFT_RIGHT of a latch 30 becomes high. If the output SHIFT_RIGHT is the high state, the delay amount of the delay unit A is increased. If an output SHIFT_LEFT thereof is the high state, the delay amount of the delay unit A is decreased. With repeating these processes, if the phase of clock CLOCK and the phase of the clock feedback signal CLOCK_FEEDBACK are coincident with each other, a phase of a signal DLL_LOCK showing that the delay locked loop is locked becomes high. This situation is the same as the timing chart of FIG. 2, and the clock feedback signal CLOCK_FEEDBACK has a phase lagging by a delay amount D of the delay unit A and a delay amount of the replica B, comparing with the clock CLOCK. Namely, if the delay locked loop is locked, D+T=1T (T: clock period). Therefore, the output of the delay unit A has a phase leading by a delay amount R of the replica B, comparing with the phase of the clock, as shown in FIG. 2.

Typically, if the delay locked loop is locked, in order to be insensitive to a voltage variation of an external power supply, a circuit is installed to perform a limiting function so that the variation of the delay amount does not occur. At this time, if a frequency of the clock CLOCK inputted from the external chipset is abruptly increased, the phase of the clock CLOCK and the phase of the clock feedback signal CLOCK_FEEDBACK, which are initially identical to each other as shown in FIG. 5, are not coincident with each other. Thus, the output data DATA is not coincident with the phase of the clock CLOCK. This problem is continuously maintained before the delay locked loop is reset.

In general, a semiconductor circuit is reset by a power up signal generated when all semiconductor circuits are powered up when the semiconductor circuit is powered up. Namely, since the conventional delay locked loop is a structure reset by both a power up signal PWRUP generated when powering up and a self refresh operation signal, so that, even though, the phase of the clock CLOCK and the phase of the clock feedback signal CLOCK_FEEDBACK, which has initially been coincident with each other do not become coincident by a change of the clock, the delay locked loop can not be reset as long as a power up signal is not newly supplied.

SUMMARY OF THE INVENTION

The present invention is directed to a delay locked loop to be reset to the initial state when a frequency of the clock applied from an external chipset is varied.

According to a preferred embodiment of the present invention, a delay locked loop comprises: a delay unit for delaying a clock supplied from an external chipset by a predetermined delay amount; a replica for delaying the clock delayed in the delay unit by a delay amount of a clock path and a data path; and a phase detector for generating a signal for controlling the delay amount of the delay unit in comparison of the clock supplied from the external chipset with a phase of an output of the replica, and generating a reset signal through detection of a change of a clock frequency supplied from the external chipset.

DETAILED DESCRIPTION OF PREFERRED EMBODIMENTS

Figure 1:
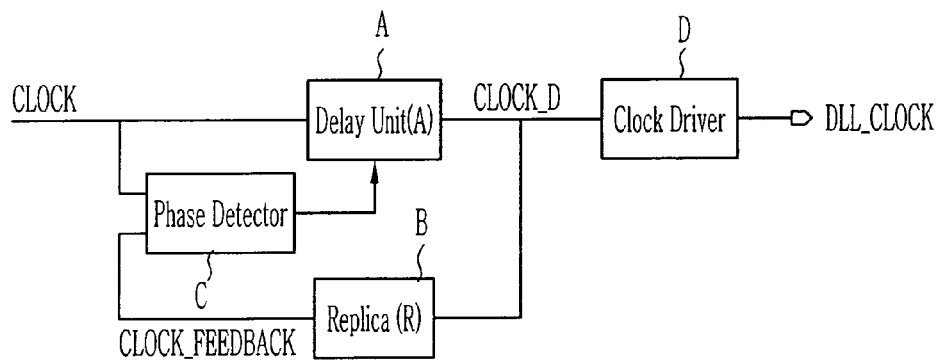
FIG. 1 is a schematic block diagram showing a prior art delay locked loop.
Figure 2:
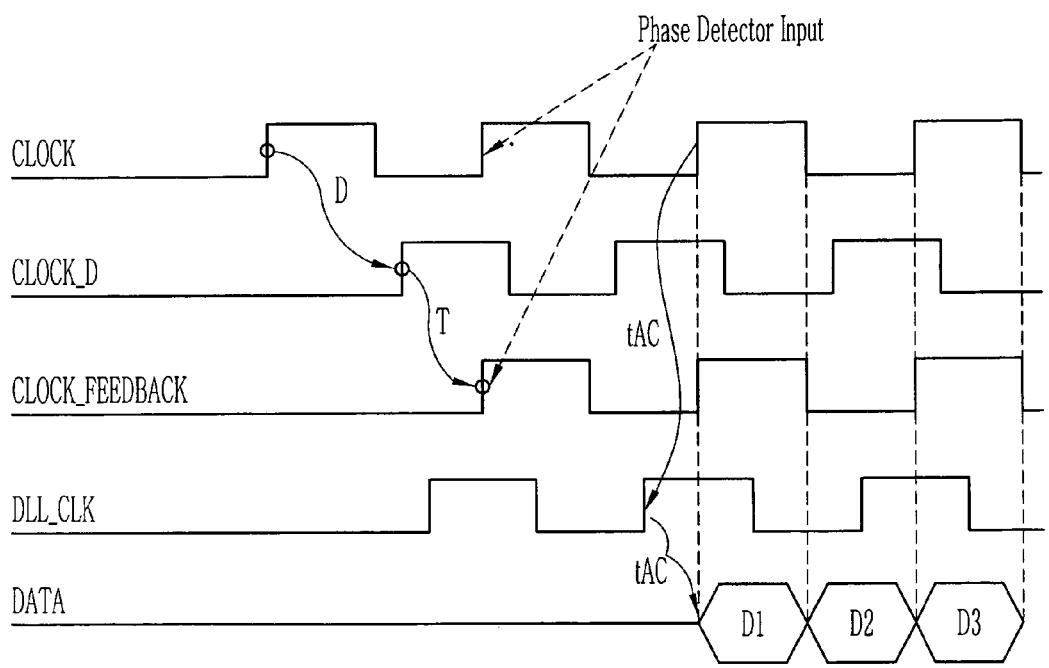
FIG. 2 is a time chart for explaining the operation of the prior art delay locked loop of FIG. 1.

Referring to the drawings, a delay locked loop in accordance with the present invention will be explained in detail below.

The construction of the delay locked loop of the present invention is the same as that of the prior art of FIG. 1 except for the phase detector. Therefore, the phase detector will be explained as follows.

Figure 6:
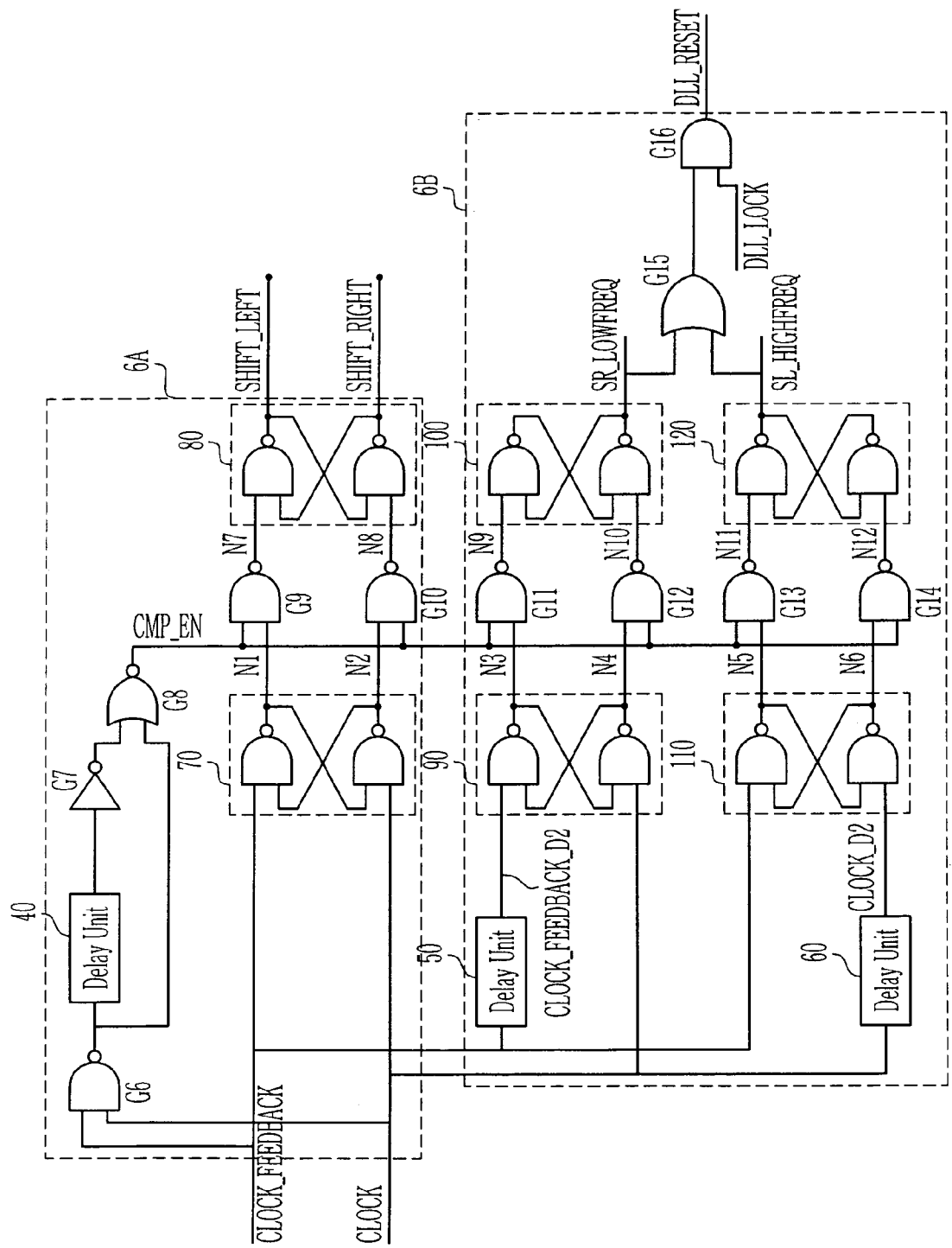
FIG. 6 is a detailed circuit of a phase detector employed in a delay locked loop according to the present invention.

FIG. 6 is a detailed circuit of a phase detector employed in a delay locked loop according to the present invention, which will be explained in detail referring to FIGS. 7 and 8.

Figure 3:
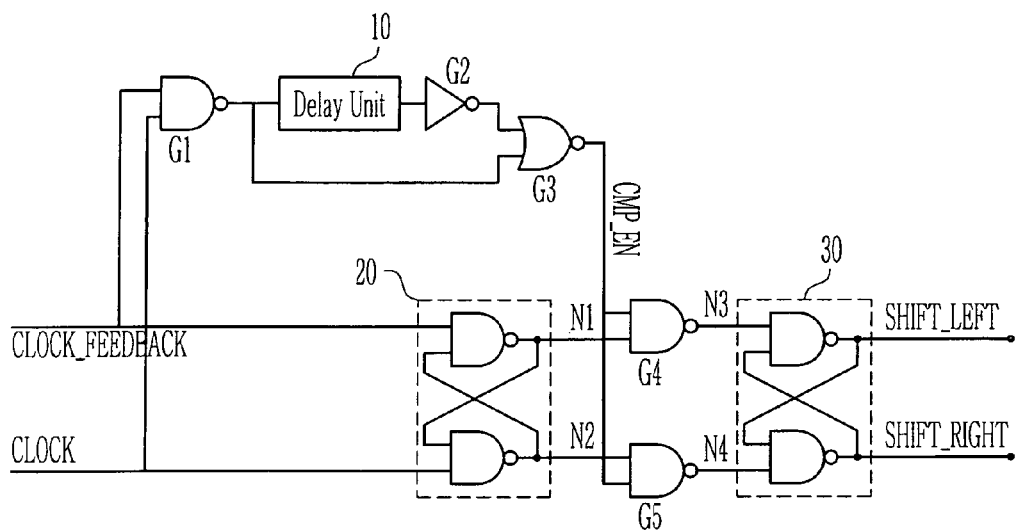
FIG. 3 is a detailed circuit diagram of a phase detector of FIG. 1.
Figure 4:
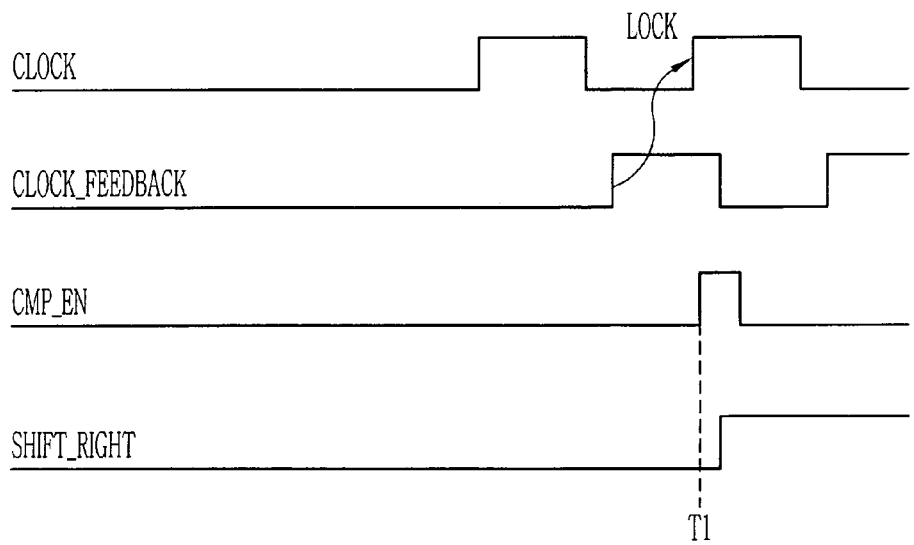
FIG. 4 is a timing chart for explaining the operation of the phase detector of FIG. 3.
Figure 5:
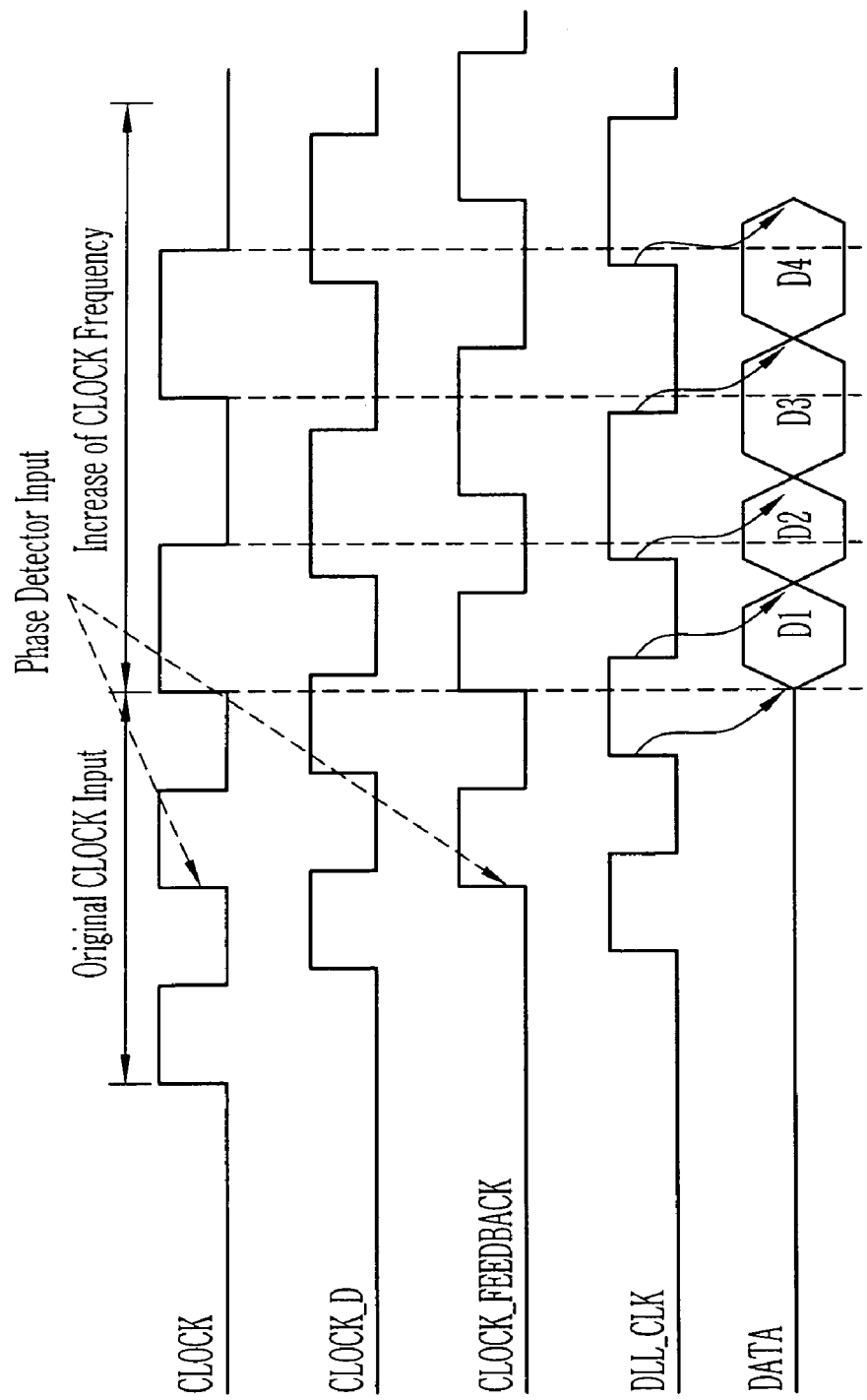
FIG. 5 is a timing chart for explaining problems of the prior art delay locked loop.

Referring to FIG. 6, the phase detector of the present invention comprises a phase detecting unit 6A and a DLL resetting unit 6B. The phase detecting unit 6A is implemented as the same of FIG. 3.

The DLL resetting unit 6B according to the present invention generates a DLL reset signal DLL_RESET using a clock CLOCK and a clock feedback signal CLOCK_FEEDBACK.

1. In the Case Where a Clock Frequency is Not Changed

Initially, a delay amount of the delay unit A is set to "0", the clock feedback signal CLOCK_FEEDBACK generates a signal lagging by a delay amount of the replica B, comparing with the clock CLOCK. At this time, the phase detector C compares phases at a rising edge of the clock CLOCK.

Since the clock CLOCK is not identical to the clock feedback signal CLOCK_FEEDBACK at the initial time, an output of a NAND gate G6 is a low state. Until a signal passing a delay unit 40 and an inverter G7 is the high state, an output CMP_EN of a NOR gate G8 maintains a high state. During this time, an output node N1 of a latch 70 maintains the low state and an output node N2 maintains the high state. An output N7 of a NAND gate G9 becomes high, and an output N8 of a NAND gate G10 becomes low. Therefore, an output SHIFT_RIGHT of a latch 80 becomes high. If the output SHIFT_RIGHT is the high state, the delay amount of the delay A is increased. If an output SHIFT_LEFT is the high state, the delay amount of the delay unit A is decreased. Through these processes, the phase of the clock CLOCK and the clock feedback phase CLOCK_FEEDBACK are identical to each other, and a signal DLL_LOCK showing that the delay locked loop is locked becomes high.

2. In the Case Where a Clock Frequency is Increased

Figure 7:
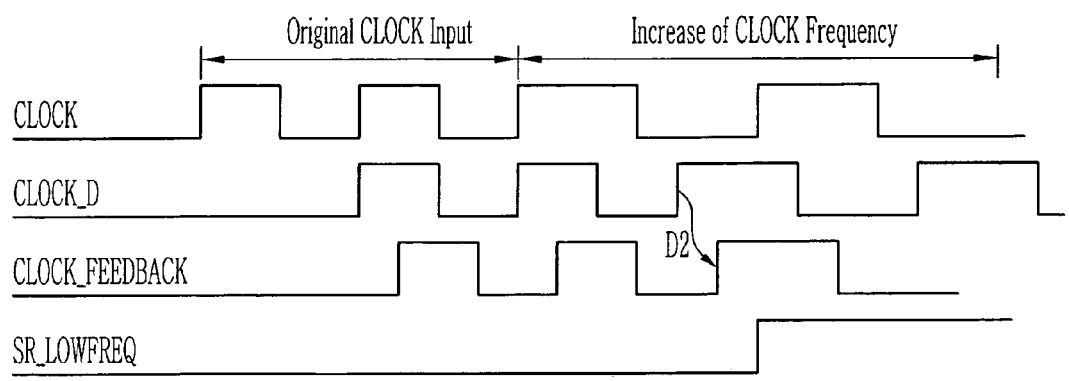
FIGS. 7 and 8 are timing charts for explaining the operation of FIG. 6.

In case that the frequency of the clock CLOCK supplied from the external chipset is abruptly increased as shown in FIG. 7, even though the phase of the clock CLOCK and the phase of the clock feedback signal CLOCK_FEEDBACK are identical to each other, the phase of the clock feedback signal CLOCK_FEEDBACK abruptly leads the phase of the clock CLOCK after the clock period is increased. The clock feedback CLOCK_FEEDBACK is constantly delayed in a delay unit 50 and then converted to a delayed clock feedback signal CLOCK_FEEDBACK_D2. Namely, the phase of the delayed clock feedback CLOCK_FEDBACK_D2 leads comparing with the phase of the clock CLOCK. Therefore, an output node N3 of a latch 90 becomes low and an output node N4 becomes high. An output N9 of a NAND gate G11 becomes high and an output N10 of a NAND gate G12 becomes low. Since an output SR_LOWFREQ of a latch 100 becomes high, an output of an OR gate G15 becomes high. Since the lock signal DLL_LOCK was the high state, an output DLL_RESET of a NAND gate N16 becomes high. Therefore, the delay locked loop is reset to the initial state. At this time, the delay amount of the delay unit 50 is determined according to the operated system and the circuit.

3. In the Case Where a Clock Frequency is Decreased

Figure 8:
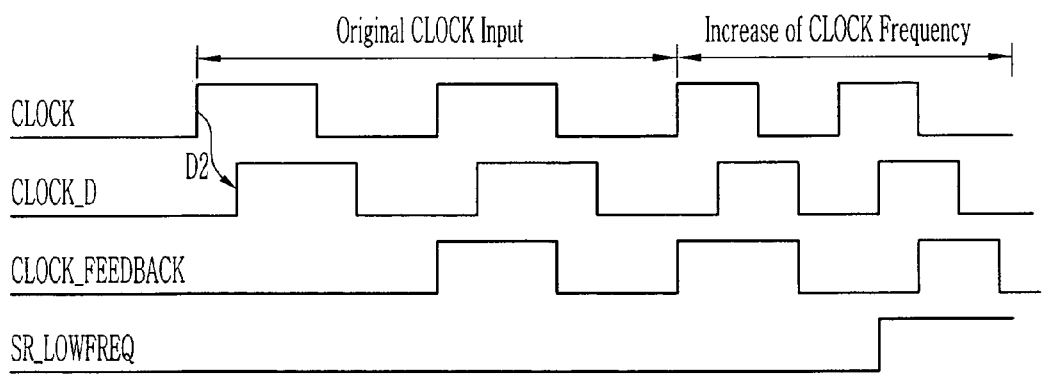

A frequency of the clock CLOCK supplied from the external chipset is abruptly decreased as shown in FIG. 8, even though the phase of the clock CLOCK and the phase of the clock feedback signal CLOCK_FEEDBACK are identical to each other, the phase of the clock feedback signal CLOCK_FEEDBACK abruptly lags the phase of the clock after the clock period is increased. The clock CLOCK is constantly delayed in a delay unit 60 and then converted to a delayed clock CLOCK_D2. Namely, the phase of the delayed clock CLOCK_D2 is led, comparing with the phase of the clock feedback signal CLOCK_FEEDBACK. Therefore, an output node N5 of a latch 110 becomes high, and an output node N6 becomes low. An output N11 of a NAND gate G13 becomes low and an output N12 of a NAND gate G14 becomes high. Since an output SL_HIGHWFREQ of a latch 120 becomes high, the output of the OR gate G15 becomes high. Since the lock signal DLL_LOCK was the high state, an output DLL_RESET of a NAND gate G16 becomes high. Therefore, the delay locked loop is reset to the initial state. The output DLL_RESET is connected to a terminal of the delay locked loop, which is not shown in the drawings. Preferably each of the lathes 70, 80, 90, 100, 110 and 120 is implemented by an SR flip-flop.

Here, the delay amount of the delay unit 60 is determined according to the operated system and the circuit.

From the principle above, the malfunction of the delay locked loop can be prevented by resetting the delay locked loop in response to the abrupt change of the frequency of the clock supplied from the external chipset.

Meanwhile, even though the preferred embodiment of the present invention is implemented by considering both of the increase and the decrease of the clock frequency, we can readily appreciate that it can be modified to reset by either the increase or the decrease of the clock frequency.

Also, in consideration of circuit design, even though the reset means for the DLL is implemented to be included in the phase detector, we can easily appreciate that the reset means for the DLL can be separately installed there from, which is also modified from the present invention.

According to the forgoing description of the present invention, if the period of the clock supplied form the external chipset is abruptly increased or decreased from a normal state as the delay locked loop is reset and locked again, the malfunctions of the internal circuit and the output data can be prevented.

While the present invention has been described with reference to the illustrative embodiments, various modifications of the illustrative embodiments will be apparent to those skilled in the art on reference to this description. It is therefore contemplated that the appended claims will cover any such modifications or embodiments as fall within the true scope of the invention.

What is claimed is:

1. A delay locked loop, comprising:
   a delay unit for delaying a clock supplied from an external chipset by a predetermined delay amount;
   a replica for delaying the clock delayed in the delay unit by a delay amount of a clock path and a data path; and
   a phase detector for generating a signal for controlling the delay amount of the delay unit in comparison of the clock supplied from the external chipset with a phase of an output of the replica, and further generating a reset signal through detection of an increment or a decrement of a clock frequency supplied from the external chipset after bringing the output of the replica into alignment with the clock supplied from the external chipset.

2. The delay locked loop according to claim 1, wherein the phase detector includes:
   a phase detecting unit for generating the signal for controlling the delay amount of the delay unit by comparing the clock supplied from the external chipset with the phase of the replica;
   a first detecting unit for detecting an increase of the clock frequency supplied from the external chipset;
   a second detecting unit for detecting a decrease of the clock frequency supplied from the external chipset; and
   a reset signal generation unit for generating the reset signal according to outputs of the first and the second detecting units and a delay locked loop locking signal.

3. The delay locked loop according to claim 2, wherein the first detecting unit includes:
   a first delay unit for delaying the output of the replica;
   a third latch to which the clock and the output of the first delay unit is inputted;
   a third inverting unit for inverting a first output of the third latch according to the enable signal, and outputting the first inverted output;
   a fourth inverting unit for inverting a second output of the third latch according to the enable signal, and outputting the second inverted output; and
   a fourth latch for generating a first detecting signal according to the outputs of the third and the fourth inverting units.

4. The delay locked loop according to claim 2, wherein the second detecting unit includes:
   a second delay unit for delaying the clock;
   a fifth latch to which the output of the replica and the output of the second delay unit is inputted;
   a fifth inverting unit for inverting a first output of the fifth latch according to the enable signal, and outputting the first inverted output;
   a sixth inverting unit for inverting a second output of the fifth latch according to the enable signal, and outputting the second output; and
   a sixth latch for generating a second detecting signal according to the outputs of the fifth and the sixth inverting units.

5. The delay locked loop according to claim 2, wherein the reset signal generation unit includes:
   an OR gate for receiving the outputs of the first and the second detecting units; and
   an AND gate for receiving the output of the OR gate and the delay locked loop locking signal, and generating the reset signal.

6. The delay locked loop according to claim 2, wherein the phase detector includes:
   an enable signal generation unit for generating an enable signal by comparing the clock with the output of the replica;
   a first latch to which the clock and the output of the replica is inputted;
   a first inverting unit for inverting a first output of the first latch according to the enable signal, and outputting the first inverted output;
   a second inverting unit for inverting a second output of the first latch according to the enable signal, and outputting the second inverted output; and
   a second latch for generating a first shift signal for increasing the delay amount of the delay unit and a second shift signal for decreasing the delay amount of the delay unit, according to the outputs of the first and the second inverting units.

7. The delay locked loop according to claim 6, wherein each of the first and second latches includes an SR flip-flop.

8. The delay locked loop according to claim 6, wherein each of the first and second inverting units includes a NAND gate.

9. The delay locked loop according to claim 6, wherein the enable signal generation unit includes:
   a NAND gate to which the clock and the output of the replica is inputted;
   a delay unit for delaying an output of the NAND gate; and
   a NOR gate for inputting the output of the NAND gate and the inverted output of the delay unit and generating the enable signal.

10. The delay locked loop according to claim 6, wherein the first detecting unit includes:
    a first delay unit for delaying the output of the replica;
    a third latch to which the clock and the output of the first delay unit is inputted;
    a third inverting unit for inverting a first output of the third latch according to the enable signal, and outputting the first inverted output;
    a fourth inverting unit for inverting a second output of the third latch according to the enable signal, and outputting the second inverted output; and a fourth latch for generating a first detecting signal according to the outputs of the third and the fourth inverting units.

11. The delay locked loop according to claim 10, wherein each of the third and the fourth latches includes an SR flip-flop.

12. The delay locked loop according to claim 10, wherein each of the third and the fourth inverting units includes a NAND gate.

13. The delay locked loop according to claim 6, wherein the second detecting unit includes:
   a second delay unit for delaying the clock;
   a fifth latch to which the output of the replica and the output of the second delay unit is inputted;
   a fifth inverting unit for inverting a first output of the fifth latch according to the enable signal, and outputting the first inverted output;
   a sixth inverting unit for inverting a second output of the fifth latch according to the enable signal, and outputting the second output; and
   a sixth latch for generating a second detecting signal according to the outputs of the fifth and the sixth inverting units.

14. The delay locked looped according to claim 13, wherein each of the fifth and the sixth latches includes an SR flip-flop.

15. The delay locked looped according to claim 13, wherein each of the fifth and the sixth inverting units includes a NAND gate.

16. A delay locked loop, comprising:
   a delay unit for delaying a clock supplied from an external chipset by a predetermined delay amount;
   a replica for delaying the clock delayed in the delay unit by a delay amount of a clock path and a data path;
   a phase detector including a phase detecting unit for comparing the clock supplied from the external chipset with a phase of an output of the replica and controlling the delay amount of the delay unit, and
   a DLL reset unit for detecting an increment or a decrement of a clock frequency supplied from the external chipset, and generating a reset signal after bringing the output of the replica into alignment with the clock supplied from the external chipset.

17. The delay locked loop according to claim 16, wherein the DLL reset unit includes a first detecting unit for detecting an increase of the clock frequency supplied from the external chipset.

18. The delay locked loop according to claim 16, wherein the DLL reset unit includes a second detecting unit for detecting a decrease of the clock frequency supplied from the external chipset.

19. The delay locked loop according to claim 16, wherein the DLL reset includes:
   a first detecting unit for detecting an increase of the clock frequency supplied from the external chipset; and
   a second detecting unit for detecting a decrease of the clock frequency supplied from the external chipset.

20. A delay locked loop, comprising:
   a delay unit for delaying a clock supplied from an external chipset by a predetermined delay amount;
   a replica for delaying the clock delayed in the delay unit by a delay amount of a clock path and a data path;
   a phase detecting unit for comparing the clock supplied from the external chipset with a phase of an output of the replica, and controlling the delay amount of the delay unit; and
   a DLL reset unit for detecting an increment or a decrement of a clock frequency supplied from the external chipset, and generating a reset signal after bringing the output of the replica into alignment with the clock supplied from the external chipset.

21. The delay locked loop according to claim 20, wherein the DLL reset unit includes a first detecting unit for detecting increase of the clock frequency supplied from the external chipset.

22. The delay locked loop according to claim 20, wherein the DLL reset unit includes a second detecting unit for detecting decrease of the clock frequency supplied from the external chipset.

23. The delay locked loop according to claim 20, wherein the DLL reset includes:
   a first detecting unit for detecting increase of the clock frequency supplied from the external chipset; and
   a second detecting unit for detecting decrease of the clock frequency supplied from the external chipset.

* * * * *